US006564366B1

(12) United States Patent
Marchenko et al.

(10) Patent No.: US 6,564,366 B1
(45) Date of Patent: May 13, 2003

(54) METHOD FOR CHANNEL ROUTING, AND APPARATUS

(75) Inventors: Alexander M. Marchenko, Moscow (RU); Andrey P. Plis, Moscow (RU); Mikhail A. Sotnikov, Moscow (RU); Patrick McGuinness, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/486,982

(22) PCT Filed: Oct. 13, 1998

(86) PCT No.: PCT/RU98/00327
§ 371 (c)(1),
(2), (4) Date: Mar. 6, 2000

(87) PCT Pub. No.: WO00/22554
PCT Pub. Date: Apr. 20, 2000

(51) Int. Cl.[7] .............................................. G06F 17/50
(52) U.S. Cl. ................................................. 716/14; 2/11
(58) Field of Search ........................... 716/14, 1, 2, 10, 716/11, 12, 13

(56) References Cited

U.S. PATENT DOCUMENTS

| | | | | |
|---|---|---|---|---|
| 5,272,645 A | * | 12/1993 | Kawakami et al. | 364/491 |
| 5,841,664 A | * | 11/1998 | Cai et al. | 364/490 |
| 6,014,507 A | * | 1/2000 | Fujii | 716/12 |
| 6,253,363 B1 | * | 6/2001 | Gasanov et al. | 716/12 |

FOREIGN PATENT DOCUMENTS

| | | | | |
|---|---|---|---|---|
| WO | WO 97/34245 | 9/1997 | | G06F/17/50 |
| WO | WO97/34245 | 9/1997 | | G06F/17/50 |
| WO | WO 00/22554 | 4/2000 | | G06F/17/50 |

OTHER PUBLICATIONS

Naveed Sherwani: "Algorithms for VLSI Physical Design Automation", Second Edition, Kluwer Academic Publishers, Boston, Dordrecht, London, 1995, ISBN 0–7923–9592–1, pp. 267–344.

Akihiro Hashimoto, James Stevens: "Wire Routing by Optimizing Channel Assignment within Large Apertures", Proceedings of the 8th Design Automation Workshop, 1971, pp. 155–169.

David N. Deutsch: "A 'Dogleg' Channel Router", Proceedings of the 13th Design Automation Workshop, 1976, pp. 425–433.

Howard H. Chen, Ernest S. Kuh: "Glitter: A Gridless Variable–Width Channel Router", IEEE Transactions on Computer–Aided Design, vol. CAD–5, No. 4, Oct. 1986, pp. 459–465.

James Reed, Alberto Sangiovanni–Vincentelli, Mauro Santomauro: "A New Symbolic Channel Router: YACR2", IEEE Transactions on Computer–Aided Design, vol. CAD–4, No. 3, Jul. 1985, pp. 208–219.

(List continued on next page.)

Primary Examiner—Leigh M. Garbowski

(57) ABSTRACT

A channel routing method (200) comprises computing channel parameters (210), classifying a channel complexity and estimating a channel height (220), optionally, determining a trunk placement direction (225), assigning tracks and layers (230), determining a quality function QF (240), and optimizing (250). The channel complexity is classified using predetermined weighting parameters ($a_1$ to $a_4$). This classification selects a significance vector n. In the assigning step (230), the vector n is combined with the channel parameters to a criterion. The criterion is used the select the most suitable assignment. In repetitions of assigning, determining QF and optimizing steps, the significance vector n and, optionally, QF are modified. The repetition are stopped upon compliance of a breaking condition which can refer to QF.

26 Claims, 9 Drawing Sheets

OTHER PUBLICATIONS

Bryan Preas: "Channel Routing with Non–Terminal Doglegs", Proceedings of European Design Automation Conference, Glasgow, Scotland, 1990, pp. 451–458.

Preas, "Channel Routing With Non–Terminal Doglegs," IEEE, pp. 451–458 (1990).

Chen et al., "Giltter: A Gridless Variable–Width Channel Router," IEEE, pp. 459–465 (1986).

Reed et al., "A New Symbolic Channel Router: YACR2," IEEE, pp. 208–219 (1985).

* cited by examiner

180

600    650

700    750

METHOD FOR CHANNEL ROUTING, AND APPARATUS

FIELD OF THE INVENTION

The present invention generally relates to the physical design of electronic devices, and, more particularly, to channel routing.

BACKGROUND OF THE INVENTION

Computer aided design plays a key role in providing electronic circuits with very large scale integration (VLSI) on the market. A useful reference is [1] Naveed Sherwani: "Algorithms for VLSI Physical Design Automation", Second Edition, Kluwer Academic Publishers, Boston, Dordrecht, London, 1995, ISBN 0-7923-9592-1. According to reference [1], the VLSI design cycle usually comprises system specification, functional design, logic design, circuit design, physical design, fabrication, packaging, testing and debugging. The physical design level has several stages, such as partitioning, floorplanning, placement, routing, and compaction. Iterations are common so that some steps are performed twice or more often. In the placement stage, the exact locations of circuit blocks and their terminals are determined and a list for interconnection nets (i.e. a netlist) between the terminals is generated. Routing is the process of finding geometric layouts for all nets in so-called routing regions between the blocks.

A channel is conveniently referred to in the art as a routing region bounded by two parallel rows of terminals. The distance between the rows, often referred to as "channel height", should be minimized to save silicon. The estimation of the channel height is very important for floorplanning iterations.

Further references for channel routing are: [2] Akihiro Hashimoto and James Stevens: "Wire routing by optimizing channel assignment within large apertures", Proceedings of the 8th Design Automation Workshop, 1971, pages 155–169; [3] David N. Deutsch: "A 'Dogleg' Channel Router", Proceedings of the 13th Design Automation Workshop, 1976, pages 425–433; [4] Howard H. Chen and Ernest S. Kuh: "Glitter: A Gridless Variable-Width Channel Router", IEEE Transactions on Computer-Aided Design, vol. CAD-5. No. 4, October 1986, pages 459–465; [5] James Reed, Alberto Sangiovanni-Vincentelli and Mauro Santomauro: "A New Symbolic Channel Router: YACR2", IEEE Transactions on Computer-Aided Design, vol. CAD-4, No. 3, July 1985, pages 208–219; and [6] Bryan Preas: "Channel Routing With Non-Terminal Doglegs", Proceedings of European Design Automation Conference, Glasgow, Scotland, 1990, pages 451–458.

The present invention seeks to provide an improved method to optimize channel routing which mitigates or avoids disadvantages and limitations of the prior art.

DETAILED DESCRIPTION OF THE PREFERRED EMBODIMENT

It is an advantage of the present invention, that it can be used to solve a number of different technical tasks. The present invention will be illustrated using terms defined in chapter 7 of reference [1], such as: branch, boundary (upper or top, lower or bottom), channel length, channel height, dogleg, net, netlist, terminal, trunk, vacant terminal, vertical constraint graph (VCG), horizontal constraint graph (HCG) and others. The present invention is conveniently explained for a grid-model but this is not limited thereto. Also, terms such as "horizontal" or "vertical" are only intended to be convenient labels for first and second directions, respectively, in a, preferably, rectangular coordinate system. Those of skill in the art are able, based on the description herein, to implement the present invention in an other coordinate system or for a gridless model.

The art knows a variety of routing methods proposed by different authors. Examples are described in chapters 6.2 to 6.8 of reference [1] and in references [2] to [5]. Some methods suit certain requirements better than other requirements. There is no routing method which suits all routing requirements. In the prior art, channel routing comprises the consecutive steps (a) creating an initial track and (b) assigning tracks and layers. The assigning step is regarded as a week point.

According to a method of the present invention, further steps are introduced. Initially, the channels are automatically analyzed and a channel complexity is classified. After routing and obtaining preliminary nets by assigning, the quality of the preliminary nets is compared to predetermined objective criteria. Depending on the comparison results, the preliminary nets are either accepted or the assigning step is repeated.

The method of the present invention is especially useful for routing tasks in which the VCG does not exhibit cyclic vertical constraints. By optimizing, the method minimizes a channel density, reduces the lengths of conductive connections, and reduces the number of trunk breaks. This leads also to a reduction in signal propagation time.

The channel height can be estimated without performing routing in detail. Such an estimate is an important parameter for the floorplanning stage and reduce the number of iterations required on the physical design level. Also, the overall chip area can be reduced. The method is flexible. For example, predetermined parameters can be chosen depending on a required optimization accuracy.

Figure 1:
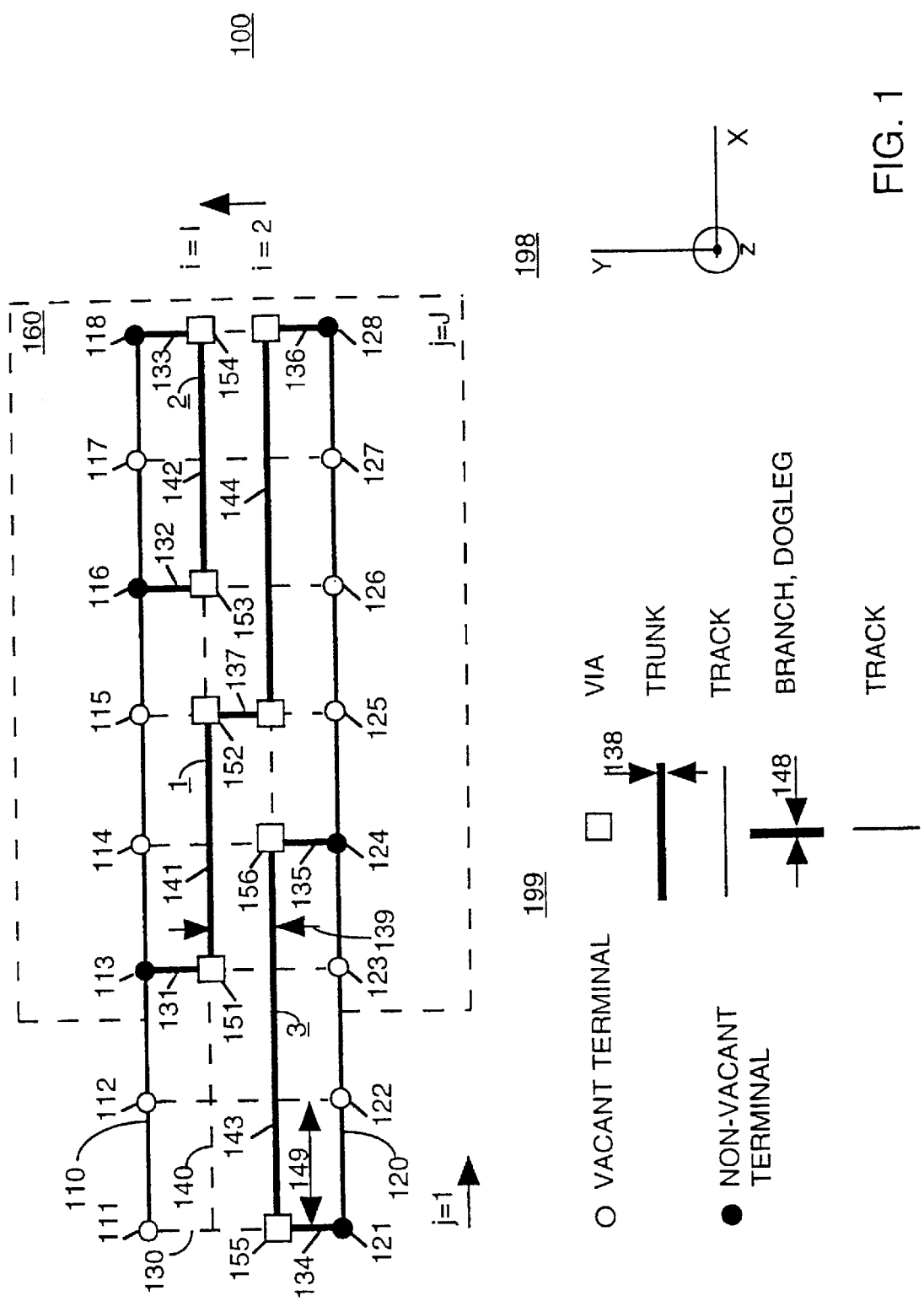
FIG. 1 illustrates a simplified schematic diagram of a channel by way of example.

FIG. 1 illustrates a simplified schematic diagram of channel 100 by way of example. For convenience, legend 198 illustrates a rectangular coordinate system with a horizontal x-axis, a vertical y-axis and a z-axis, and legend 199 illustrates drawing patterns used in FIG. 1 and in other FIGS. Channel 100 has upper boundary 110 of, for example, J=8 terminals 111–118 and lower boundary 120 of J=8 terminals 121–128. Terminals 111, 112, 114, 115 and 117 on boundary 110 and terminals 122, 125–127 on boundary 120 are vacant terminals (○ symbols); and terminals 113, 116, and 118 on boundary 110 and terminals 121, 124 and 128 on boundary 120 are non-vacant terminals (● symbols). The distinction between vacant and non-vacant terminals is convenient for explanation. In hardware implementation, the vacant terminals are not required. Vertical dashed lines 130 from upper boundary 110 to lower boundary 120 between terminals pairs 111/121 to 118/128 illustrate columns with indices j=1 to j=J (e.g., J=8); and horizontal dashed lines 140 in parallel to boundaries 120 and 110 illustrate tracks with track indices i=1 to I (e.g., I=2). Having track index i ascending from lower boundary 120 to upper boundary 110 is convenient for explanation but not essential for the present invention.

In the example of FIG. 1, bold lines illustrate conductive connections in channel 100 which are branches 131–136, dogleg 137 (vertical direction following columns), and trunks 141–144 (horizontal direction following tracks). The conductive connections are conveniently located in M layers along the z-axis. For convenience, the layers are not illustrated in FIG. 1. Conductive connections between the layers are vias 151–158 (□ symbols) located, preferably, perpendicular (z-axis) to the tracks and columns. As persons of skill in the art understand, there can be layers which can have (a) only trunks, (b) only branches or doglegs, and (c) trunks, brunches and doglegs (cf. FIG. 7.3 in reference [2]).

The conductive connections form nets between the non-vacant terminals. Branch 131 (from terminal 113), via 151, trunk 141, via 152, dogleg 137, via 157, trunk 144, via 158, and branch 136 (to terminal 128) form net 1. Branch 132 (from terminal 116), via 153, trunk 142, via 154, and branch 133 (to terminal 133) form net 2. Branch 134 (from terminal 121), via 155, trunk 143, via 156, and branch 135 (to terminal 124) form net 3.

Each trunk has a physical trunk width 138 (see legend 199). Space 139 is the physical distance between neighboring trunks (e.g., between trunks 141 and 143) and between a trunk and a boundary. In the simplified diagram of FIG. 1 and in the literature, width 138 is conveniently illustrated as being smaller than space 139. However, width 138 is, preferably, larger than space 139. Assume for convenience of explanation that width 138 and space 139 are equal throughout channel 100. A vertical unit can be defined as one width 138 plus one space 139. Neglecting one space 139 at one boundary, channel 100 has a channel height ("Channel_Height") of 2 vertical units.

Similarly, each branch or dogleg has a physical branch width 148 (see legend 199). Space 149 is the physical distance between neighboring branches (or doglegs). Width 148 is conveniently illustrated as being smaller than space 149, but in reality, width 148 can be much larger than space 149. Assume also that width 148 and space 149 is equal in channel 100. Neglecting one space 149, channel 100 has a track length ("Track_Length") of 8 horizontal units (width 148 plus space 149). Persons of skill in the art, are able based on the description herein, to practice the present invention using other measurement units.

In FIG. 1, maximum channel density area 160 (e.g., columns 3 to 8, cf. equation (1.4)) is illustrated by a dashed frame.

In the following, expressions used in method 200 (cf. FIGS. 8–9) of the present invention are explained.

A local channel density labeled "Local_Channel_Density_(j)" can be defined for each column j as the number of trunks touching or going through column j. Persons of skill in the art are able to calculate Local_Channel_Density_(j) from, for example, the HCG. In FIG. 1, values are, for example:

$$\text{Local\_Channel\_Density\_}(1) = 1 \text{ (trunk 143)} \qquad (1.2)$$

$$\text{Local\_Channel\_Density\_}(3) = 2 \text{(trunks 141 and 143)}$$

A maximum channel density labeled "Max_Channel_Density" is defined as the maximum value of Local_Channel_Density_(j) from j=1 to J. Those columns j for which $$\text{Max\_Channel\_Density} = \text{Local\_Channel\_Density\_}(j) \qquad (1.4)$$

are referred to as saturated columns j (e.g., columns 3 to 8 in area 160). The number of saturated columns labeled "Max_Columns" is smaller than or equal to J, that is:

$$\text{Max\_Columns} \leq J \qquad (1.6)$$

An average channel density labeled "Average_Channel_Density" is defined as follows:

$$\text{Average\_Channel\_Density} = \frac{1}{j} * \sum_{j=1}^{J} \text{Local\_Channel\_Density\_}(j) \qquad (1.8)$$

wherein the * symbol stands for multiplication, the fraction line stands for division, and the Σ symbol stands for multiple addition.

A path value P (j) indicates the length of the longest path in a VCG for trunks going through column j. Persons of skill in the art using mathematical graph theory are able to obtain P (j) without the need of further explanation. An average for P (j) from j=1 to J is further referred to as "PA".

Persons of skill in the art are able, based on the description herein, to derive Local_Channel_Density, Max_Channel_Density, Max_Columns, Average_Channel_Density, path value P(j) and its average PA (collectively "basic descriptors") from a channel netlist and the coordinates of the terminals without the need for further explanation.

Now, channel parameters are introduced. A first channel parameter CS (for "channel suffusion") is defined as the ratio between the average channel density and the maximum channel density, that is:

$$CS = \frac{\text{Average\_Channel\_Density}}{\text{Max\_Channel\_Density}} \qquad (1.10)$$

A second channel parameter MCDS (for "maximum channel density significance") is defined as the ratio between the number of saturated columns Max_Columns and the total number of columns J, that is $$MCDS = \frac{\text{Max\_Columns}}{J} \qquad (1.12)$$

A third channel parameter r(D,P) is a density-to-path-length correlation coefficient defined as follows:

$$r(D, P) = \frac{\sum_{j=1}^{J} [L\_C\_D(j) - A\_C\_D] * [P(J) - PA(j)]}{J * \sigma_{L\_C\_D} * \sigma_P} \qquad (1.14)$$

wherein L_C_D (j) is an abbreviation for "Local_Channel_Density (j)", A_C_D is an abbreviation for "Average_Channel_Density", $\sigma_{L\_C\_D}$ stands for a standard deviation of L_C_D (j) for j=1 to J, and $\sigma_P$ stands for a standard deviation of P(j) for j=1 to A fourth channel parameter BS (for "boundary suffusion") is defined as the ratio between the number of "busy" columns labeled "Busy_Columns" which have conductive connections to non-vacant terminals (e.g., branches, doglegs, or vias) and the total number of columns J, that is:

$$BS = \frac{\text{Busy\_Columns}}{J} \quad (1.16)$$

Using channel parameters CS, MCDS, r(D,P), and BS and predetermined weighting parameters, $a_1$, $a_2$, $a_3$, and $a_4$, a channel complexity labeled "Complexity" is defined as the sum of ratios between channel parameters and weighting parameters, that is:

$$\text{Complexity} = \frac{CS}{a_1} + \frac{MCDS}{a_2} + \frac{r(D, P)}{a_3} + \frac{BS}{a_4} \quad (1.18)$$

Figure 3:
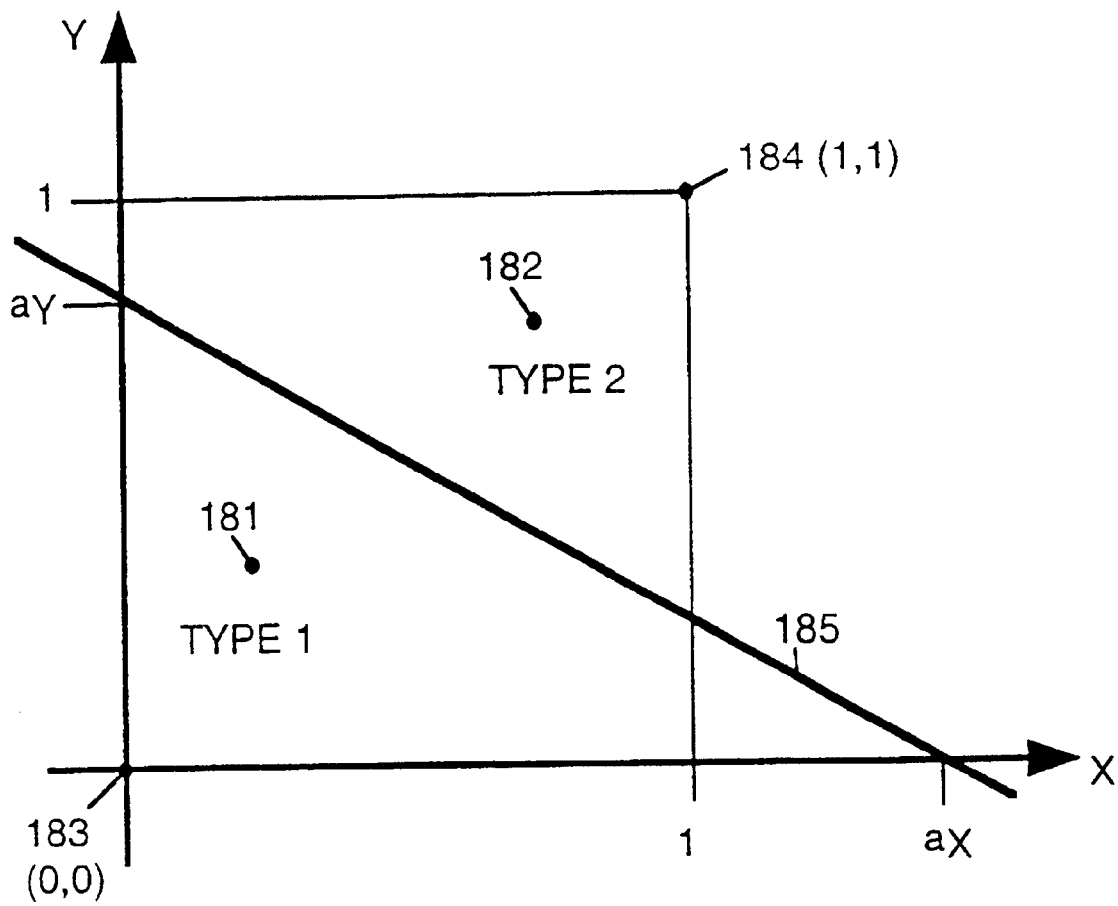
FIG. 3 illustrates a simplified diagram of a complexity function.

A complexity function is explained with more detail in connection with FIG. 3. To include all 4 summands into equation (1.18) is convenient, but not essential for the present invention. The channel complexity can be obtained for any other number of summands in other combinations. Weighting parameters $a_1$ to $a_4$ (collectively "a") are in a useful value range between $$0.7 \leq a \leq 4.6 \quad (1.20)$$

Convenient ranges are:

$$1.3 \leq a_1 \leq 1.7 \quad (1.22)$$

$$0.7 \leq a_2 \leq 0.9$$

$$3.8 \leq a_3 \leq 4.6$$

$$1.7 \leq a_4 \leq 2.1$$

For channel 100 having M=2 layers, preferred values are approximately, $a_1$=1.5, $a_2$=0.8, $a_3$=4.2, and $a_4$=1.9.

Using the channel complexity, a channel quality labeled "Quality" is defined as a sum of a product of the channel complexity with a first predetermined factor ("Factor") and a predetermined offset labeled "Offset", that is:

$$\text{Quality} = \text{Factor} * \text{Complexity} + \text{Offset} \quad (1.24)$$

Factor and Offset can be obtained, for example, by least square regression of experimental values. Persons of skill in the art know how to perform such estimations. The value for Factor is conveniently in the range between $$0.1 \leq \text{Factor} \leq 0.2 \quad (1.26)$$

A preferred value is approximately Factor=0.13. The value for Offset is conveniently in the range between $$0.8 \leq \text{Offset} \leq 0.9 \quad (1.28)$$

A preferred value is approximately Offset=0.87. A preliminary channel height ("Channel_Height") from the channel parameters can be estimated, for example, according to the following equation:

$$\text{Channel\_Height} = \text{Max\_Channel\_Density} * \text{Quality} \quad (1.30)$$

Figure 2:
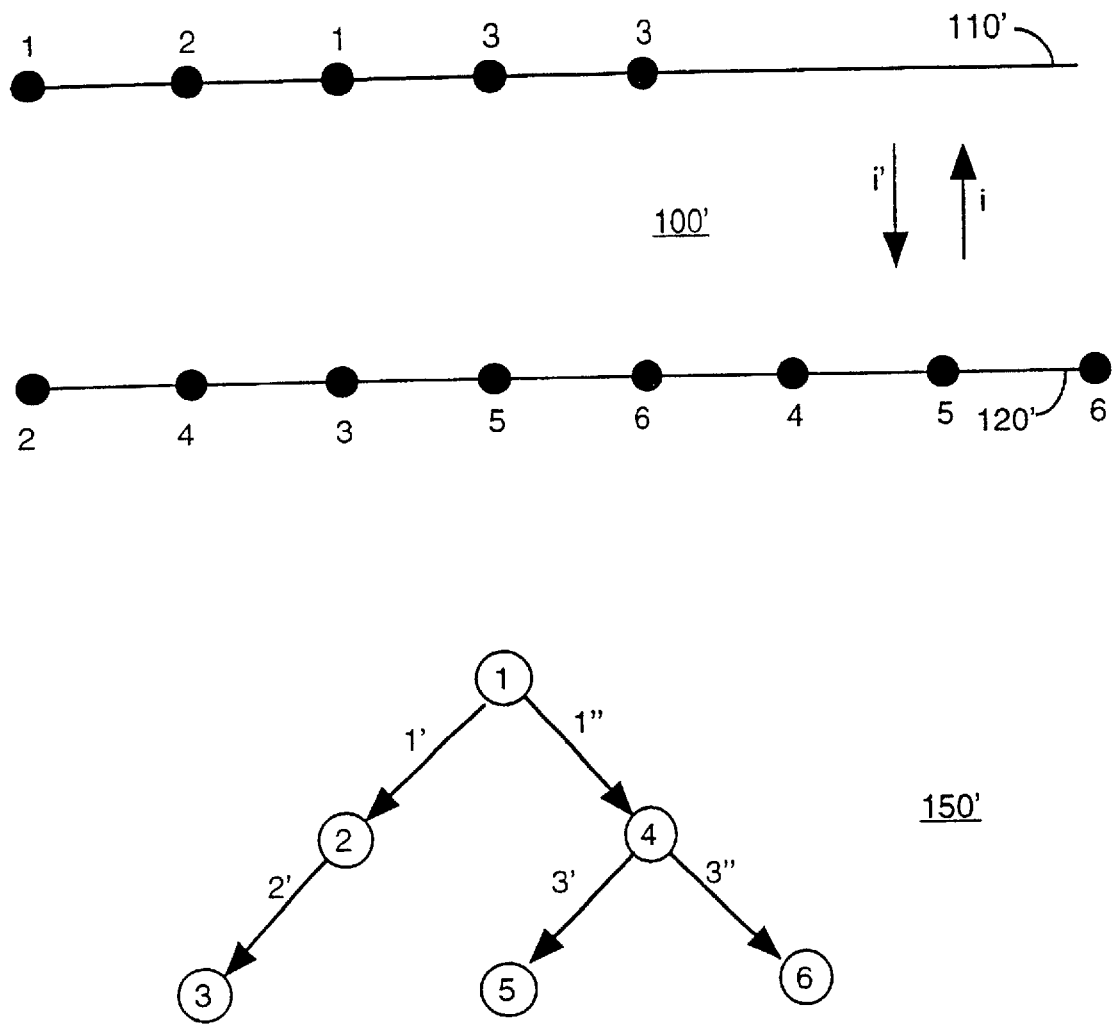
FIG. 2 is a simplified schematic diagram of a further channel and its vertical constraint graph (VCG) by way of example.

FIG. 2 is a simplified schematic diagram of further channel 100' and its VCG 150' by way of example. Channel 100' has upper boundary 110' with 5 non-vacant terminals ("Upper_Terminals", ● symbols) and lower boundary 120' with 8 non-vacant terminals ("Lower_Terminals", ● symbols). Arabic numbers 1–6 at the terminals illustrate nets 1–6 which should be established according to the netlist (see also FIG. 7.4 of reference [1]. For convenience, columns and tracks and conductive connections of the nets are not shown. Assigning trunks to tracks can start either at lower boundary 120' (direction of incrementing index i, cf. FIG. 1) or at upper boundary 110' (opposite direction with primed index i'). The preferred trunk assignment direction (PTAD) can be determined by analyzing VCG 150' and comparing a further channel parameter RF (for "ramification factor") to a predetermined value. This is performed, for example, in step 225 of method 200 explained later in connection with FIG. 8.

VCG 150' has 6 nodes for each net (①  to ⑥ symbols for nets 1 to 6, respectively) and directed edges (edge 1" from node ① to node ②, edge 2' from node ② to node ③, edge 1" from node ① to node ④, edge 3' from node ④ to node ⑤, and edge 3" from node ④ to node ⑥. Nodes ①, ② and ④ are nodes from which edges depart ("Edge_Departing_Nodes"), and nodes ②, ③, ④, ⑤, and ⑥ are nodes to which edges arrive ("Edge_Arriving_Nodes"). Nodes ② and ④ belong to both groups.

Parameter RF is defined by the corresponding numbers of terminals and nodes as follows:

$$RF = \frac{(\text{Upper\_Terminals} + 1) * \text{Edge\_Departing\_Nodes}}{(\text{Lower\_Terminals} + 1) * \text{Edge\_Arriving\_Nodes}} \quad (2.2)$$

In the example of FIG. 2, parameter RF is obtained as:

$$RF = \frac{(5+1)*3}{(8+1)*5} = \frac{18}{45} = 0.4 \quad (2.4)$$

For RF≤1 (as in the example), the PTAD is the direction from lower boundary 120' to upper boundary 110' (index i). For RF>1, the PTAD is opposite (primed index i').

In other words, for a task of routing nets in channel 100' having a first number (e.g., "Upper_Terminals") of non-vacant terminals at a first boundary (e.g., boundary 110') and a second number ("Lower_Terminals") of non-vacant terminals at a second boundary (e.g., boundary 120'), a direction for assigning trunks to tracks (PTAD) can be determined with the following steps: (a) Obtaining VCG 150' (with nodes and edges) of channel 100'; (b) Determining a first number of nodes in VCG 150' from which edges depart and determining a second number of nodes in VCG 150' to which edges arrive; (c) Combining the first and second numbers of non-vacant terminals and the first and second numbers of nodes to a parameter (e.g., as in equation (2.4)); (d) Comparing the parameter to a predetermined value (e.g., "1") and (i) in case the parameter smaller than or equal to predetermined value (e.g., RF≤1), determine the direction from the second boundary to the first boundary, or (ii) in case the parameter is larger than the predetermined value (e.g., RF>1), determine the direction from the first boundary to the second boundary.

FIG. 3 illustrates simplified diagram 180 of the complexity function introduced in connection with equation (1.18). The complexity function has up to 4 variables: CS, MCDS, r(D,P) and BS. For convenience, diagram 180 illustrates in a two-dimensional vector room ($R^2$) a similar, but simplified function Z=f (X, Y) with variables Y versus X, that is:

$$Z = \frac{Y}{a_Y} + \frac{X}{a_X} \quad (3.2)$$

Result Z stand for complexity, and arguments X and Y stand for any channel parameters in the complexity function (equation (1.18)) and parameters $a_X$ and $a_Y$ stand for any corresponding weighting parameters (from $a_1$ to $a_4$). In diagram 180, the function is illustrated for a result Z=1 with values alongside line 185 connecting points $(0, a_Y)$ on the Y-axis and $(a_X, 0)$ on the X-axis.

The magnitude relation of the channel complexity (corresponds to Z) to a threshold classifies a first channel complexity type ("TYPE 1") and a second channel complexity type ("TYPE 2"). The types are conveniently distinguished as:

TYPE 1 in case of: Complexity≦Threshold (3.4)

TYPE 2 in case of: Complexity>Threshold (3.6)

Conveniently, the threshold has value of:

Threshold=1, (3.8)

If arguments X, Y form a value pair (X,Y) (reference 181) below threshold line 185 or on line 185, then Z has values below 1 or equal to 1 (TYPE 1, complexity≦threshold). Otherwise, if arguments X, Y form a value pair above line 185 (reference 182), then Z has values above 1 (TYPE 2, complexity>threshold). Extreme pairs are pair (X, Y)=(0, 0) for TYPE 1 (reference 183) and pair (X, Y)=(1, 1) for TYPE 2 (reference 184). Describing a threshold in the $R^2$-representation of diagram 180 by threshold line 185 is convenient for explanation. Persons of skill in the art are able to derive equivalents to line 185 as in other vectors rooms, such as in $R^3$ and in $R^4$ for more or all parameters.

Figure 4:
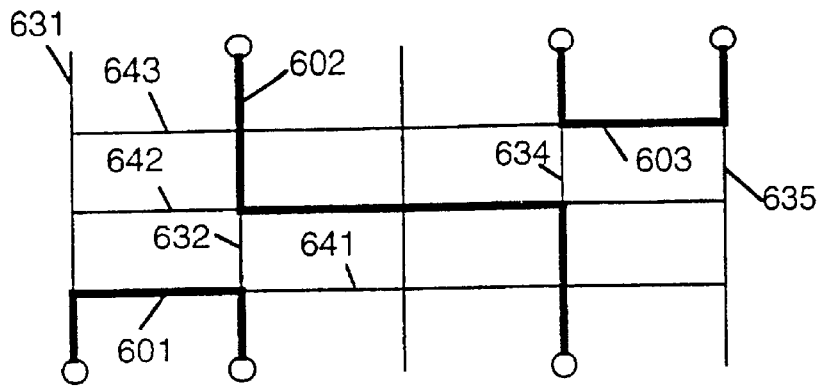
FIGS. 4–5 illustrate simplified schematic diagrams of channels and their corresponding vertical constraint graphs (VCGs) by way of example.
Figure 4:
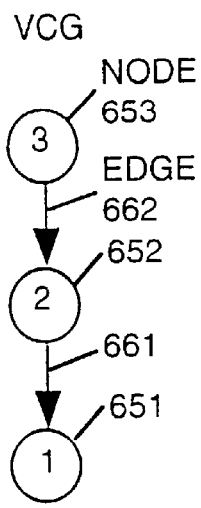
Figure 5:
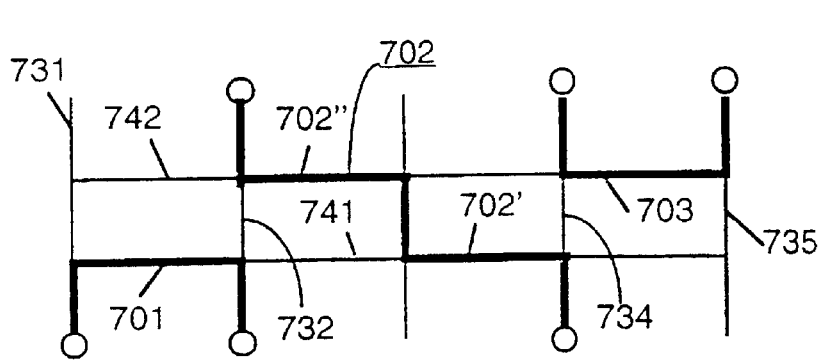
Figure 5:
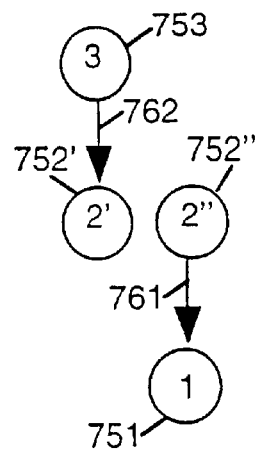

FIGS. 4–5 illustrate simplified schematic diagrams of channels 600 and 700, respectively, and their corresponding vertical constraint graphs (VCGs) 650 and 750, respectively, by way of example. Channels 600 and 700 both have 5 columns (631–635 in FIG. 4, 731–735 in FIG. 5). In channels 600 and 700, 3 nets (bold lines, references 601–603 and 701–703) of conductive connections are provided between terminals located at the same columns. Channel 600 has 3 tracks 641–643. With only 2 tracks 741–742, channel 700 has a smaller channel height. For convenience, the nets are illustrated only by trunks, doglegs, and branches.

In channel 600, nets 601–603 are branch-trunk-branch combinations. VCG 650 of channel 600 has node 653 (symbol ③ for net 603), node 652 (symbol ② for net 602), and node 651 (symbol ① for net 601). VCG 650 represents a constraint from net 603 to net 602 (in column 634) by edge 662 from node 653 to node 652, and represents a constraint from net 602 to net 601 (in column 632) by edge 661 from node 652 to node 651. The longest path in VCG 650 is formed by 3 nodes 653, 652 and 651 (maximum path length=3 nodes).

In channel 700, nets 701 and 703 are branch-trunk-branch combinations similar to nets 601 and 603, respectively, of channel 600. Net 702 is a combination of a branch, trunk 702", a dogleg, trunk 702', and a further branch. VCG 750 of channel 700 has node 753 (for net 703), node 752' (for trunk 702'), node 752" (for trunk 702"), and node 751 (for net 701). VCG 750 represents a constraint from net 703 to trunk 702' (in column 732) by edge 762, and represents a constraint from trunk 702" to net 1 (in column 734) by edge 761. The longest path in VCG 750 is formed only by only 2 nodes (maximum path length=2 nodes).

Figure 6:
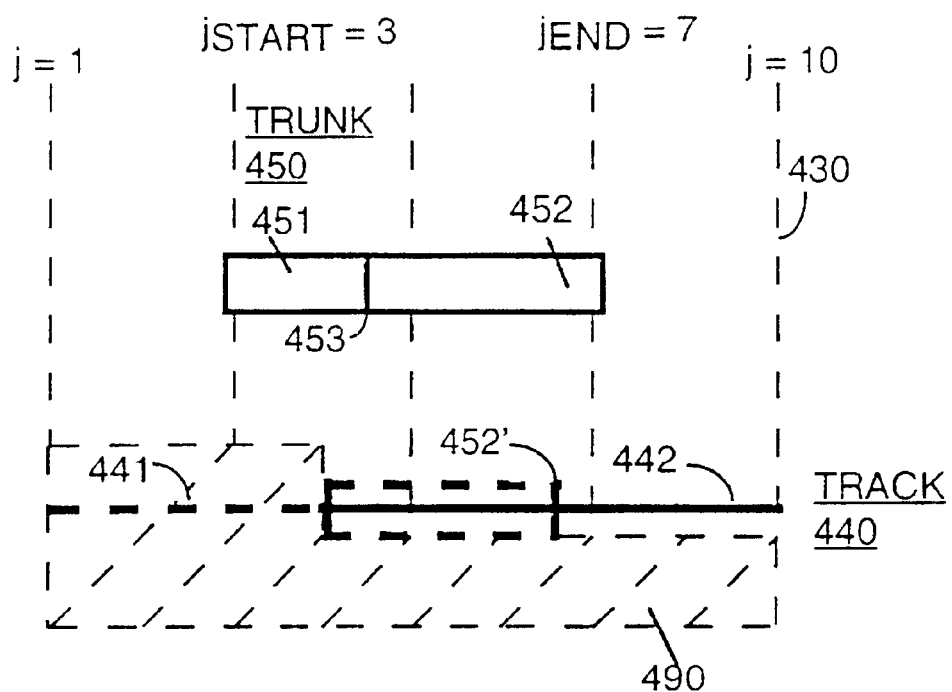
FIG. 6 illustrates a simplified schematic diagram of a non-assigned trunk and of a track by way of example.

FIG. 6 illustrates a simplified schematic diagram of non-assigned trunk 450 and track 440 by way of example. For convenience, FIG. 6 also indicates columns 430 (e.g., indices j=1 to 10). For simplicity, FIG. 6 illustrates only a single layer (index m). Persons of skill in the art know, based on the description herein, to apply FIG. 6 also for M>1 layers. In the example of FIG. 6, non-assigned trunk 450 is located across columns $j_{START}$ and $j_{END}$ (eg., $j_{START}$=3, $j_{END}$=7). In track portion 441 ("occupied portion", dashed line) located within area 490 (hatched), trunk 450 can not accommodate trunk 450. In track portion 442 ("free portion", plain line), track 440 can accommodate trunk 450 partially or totally.

To accommodate trunk 450 on track 440 or on other tracks in layer m (or in other layers), trunk 450 can optionally be broken into trunk pieces 451 and 452 (see break line 453). The number PIECES of trunk pieces can be 2 or higher (PIECES≧2). For further discussion, non-assigned trunk 450 can be identified by indices k (trunk within a track), i (track) and m (layer).

A non-assigned trunk criterion Cr (k,i,m) for each non-assigned trunk is derived from a number of Q preliminary assignment components which are explained next. For simplicity of explanation, the indices k, i and m are left out for the components and for criterion Cr. It is an advantage of the present invention that a criterion considers track i, location k on track i, and the layer m into which the trunk could be placed.

When non-assigned trunk 450 is assigned (cf. method step 230, explained later), piece 452 is coordinated to portion 442 of track 440. This is illustrated dashed as assigned trunk piece 452'. The components are intermediate results which are obtained as if a non-assigned trunk (e.g., trunk 450) would have been already assigned to a track (e.g., as portion 452'). In other words, the Q criterion components are a quantitative representation of a tentative assignment. As explained later, a decision to assign or not to assign a trunk is made later using criterion Cr.

The first component "LocD" defined as the maximum of Local_Channel_Density (j) for non-assigned trunk 450 wherein j goes across all columns (e g., $j_{START}$=3 to $j_{END}$=7) of trunk 450, that is:

$$LocD = \underset{j_{START}}{\overset{j_{END}}{\text{MAX}}} \text{Local\_Channel\_Density}(j) \quad (6.2)$$

Component LocD has been explained in reference [5].

The second component "PIECES" is the number of pieces of a non-assigned trunk. In the example, trunk 450 has PIECES=2 pieces 451 and 452. The component PIECES are mentioned in references [3] and [6].

The third component "BD" is defined as follows:

$$BD = \frac{(1 + Bot)}{(1 + Top + PIECES)} \quad (6.4)$$

wherein "Top" stands for the number of non-vacant terminals on the upper boundary (e.g., in FIG. 1, Top=3 for terminals 113, 116, 118 on boundary 110), and "Bot" stands for the number of non-vacant terminals on the lower boundary (e.g., Bot=3 for terminals 121, 124, 128 on boundary 120).

The fourth component "Trunk_Length" has been explained above and in reference [2]. For example, trunk 450 of FIG. 6 has a length Trunk_Length=5.

The fifth component "LPr" (for "Layer Priority") is, preferably, an non-negative real number LPr≧0. LPr is conveniently defined as:

$$Lpr = \frac{Lpr\,(init)}{\text{Penalty\_Direction} * \text{Penalty\_Layer}} \quad (6.6)$$

This component depends also on the layers where the trunk is located. (a) Variable Lpr (init) is a specific value for the material of conductive connections (i.e. trunks, branches, doglegs). Conveniently, Lpr (init) is defined as Lpr (init)=1 for aluminum. For other materials, Lpr (init) is, preferably, the ratio of the specific Ohmic resistance of aluminum to the specific Ohmic resistance of the other material. For example, for conductive connections made from polysilicon, this variable would be around Lpr (init)=1/300.

(b) Penalty_Direction is a number which depends on a channel model. In a first model, the channel has M'$\geq$1 layers in which only trunks are located and has M"$\geq$1 layers in which only branches/doglegs are located (M'+M"=M). Reference [1] illustrates the first model ("reserved layer model") by example in connection with FIG. 7.3. In the example of FIG. 1 of the present application, channel 100 can have M=2 layers wherein M'=1 layer (index m=1) has only trunks and M"=1 layer (index m=2) has only branches and doglegs. If the non-assigned trunk would be assigned such that the channel would to the first model, then Penalty_Direction=1 for the trunks located in any of the M' trunk layers.

In a second model ("unreserved layer model"), the channel has M'''>1 layers in which both trunks and branches/doglegs are located. For trunks in such layers, this variable would be Penalty_Direction>1. For example, a convenient value is Penalty_Direction 100. It is an advantage of the present invention, that both models can be considered, and that the model distinction goes into criterion Cr.

(c) Penalty_Layer is an indicator which is applied when channel 100 has M>2 layers. For M=1 or M=2, equation (6.6) is solved for Penalty_Layer=1. Penalty_Layer is a function of the z-axis (cf. FIG. 1), or in other words, a function m, that is:

Penalty_Layer=Function (m)     (6.8)

For M=3, convenient values for Penalty_Layer are:

Penalty_Layer=1 (for m=1)     (6.10)

Penalty_Layer=10 (for m=2)

Penalty_Layer=1 (for m=3)

Generally, Penalty_Layer can be conveniently obtained by a square function Function (m) which has values of Function (1)=1 and Function (M) and which has a maximum for M/2 (even M) or (M+1)/2 (odd M).

The sixth component "DerP" is the highest difference between the P(j) values (j between $j_{START}$ to $j_{END}$) of non-assigned trunk. The seventh component "Max_Path" is the maximum number of nodes in a VCG representation of required connections between non-vacant terminals. This component has been explained in reference [4].

Criterion Cr is calculated as the multiple product of the $nq^{th}$ power of the Q components ("Component_q"), that is:

$$Cr = \prod_{q=1}^{Q} (\text{Component\_}q)^{nq} \quad (6.12)$$

The power nq is a factor significance and can be any positive and negative real number. As used herein, a factor significance vector n (underscoring for "vector") is defined as the plurality of nq from q=1 to Q, that is:

$$n=(n1, n2, \ldots, nq, \ldots, nQ) \quad (6.14)$$

The number Q=7 is convenient for implementing the present invention, but not necessary. Cr can be calculated with more or with less components. If the Q=7 components are used, Cr is calculated as follows:

$$Cr = (LocD)^{n1} * \quad (6.16)$$

$$(PIECES)^{n2} *$$

$$(BD)^{n3} *$$

$$(\text{Trunk\_Length})^{n4} *$$

$$(LPr)^{n5} *$$

$$(DerP)^{n6} *$$

$$(\text{Max\_Path})^{n7}$$

For nq=0, the multiplication factor becomes 1 and the component is not considered. Preferably, factor significance vector n can be changed in iterations (explained later). Preferably, factor significance vector n is initially selected from predetermined vectors $_{(1)}n$ and $_{(2)}n$ depending on the channel complexity type (cf. equations (3.4) to (3.6)).

For example, values for vector n are:

$$_{(1)}n=(1.79, -0.14, 1.51, 1.35, 0.00, 0.00, 0.59) \quad (6.20)$$

$$_{(2)}n=(-0.14, 0.62, 0.34, 1.10, -1.50, -0.05, 0.23) \quad (6.22)$$

Based on the description herein, persons of skill in the art can select factor significance vector n with other values. Convenient values ranges are given in the following table:

(6.24)

| TYPE 1, vector $_{(1)}n$ | TYPE 2, vector $_{(2)}n$ |
|---|---|
| $1.6 \leq n_1 \leq 2.0$ | $-0.2 \leq n_1 \leq 0.0$ |
| $-0.2 \leq n_2 \leq 0.0$ | $0.4 \leq n_2 \leq 0.8$ |
| $1.3 \leq n_3 \leq 1.7$ | $0.1 \leq n_3 \leq 0.5$ |
| $1.1 \leq n_4 \leq 1.5$ | $0.9 \leq n_4 \leq 1.3$ |
| $-0.1 \leq n_5 \leq 0.1$ | $-1.7 \leq n_5 \leq -1.3$ |
| $-0.1 \leq n_6 \leq 0.1$ | $-0.2 \leq n_6 \leq 0.0$ |
| $0.4 \leq n_7 \leq 0.8$ | $0.0 \leq n_7 \leq 0.4$ |

Figure 7:
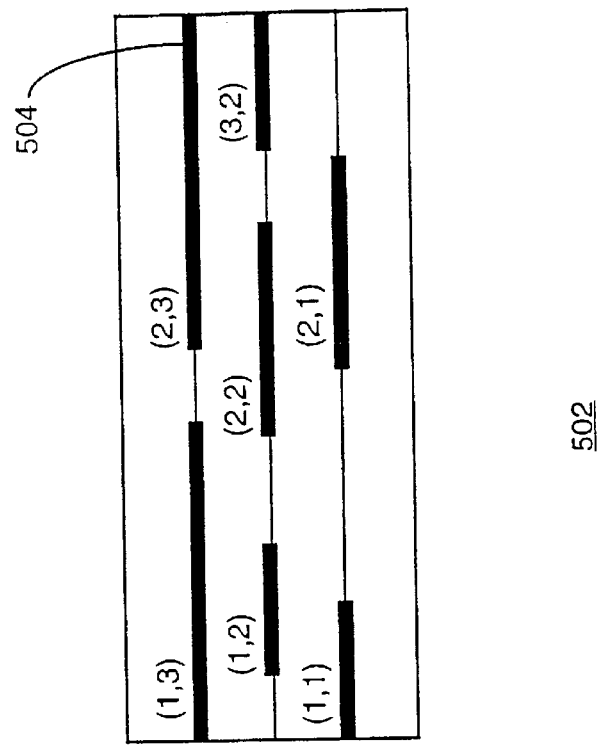
FIG. 7 illustrates simplified schematic diagrams of two channels to explain a quality function.
Figure 7:
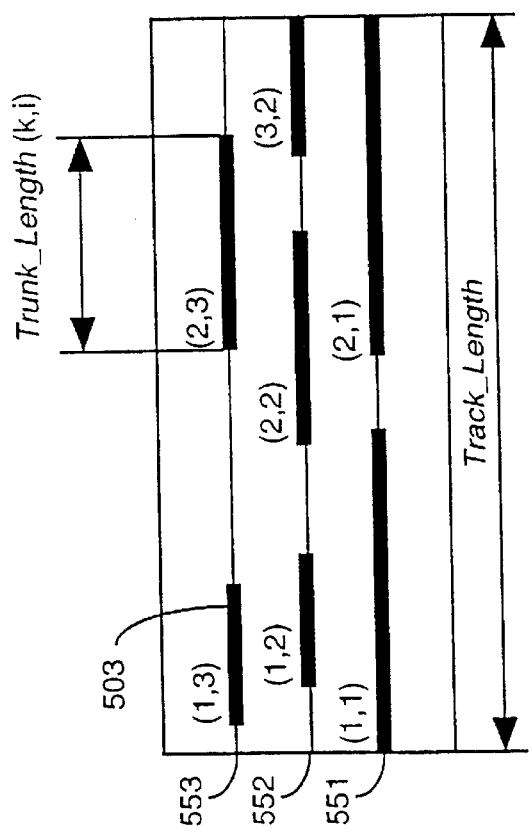

FIG. 7 illustrates simplified schematic diagrams of channels 501 and 502 to explain a quality function QF. Channels 501 and 502 each have I=3 tracks (common references 551 for i=1, 552 for i=2 and 553 for i=I) with trunks 503 and 504, respectively. In channel 501, trunks 503 are referred to by indices (k,i): trunks (1,1) and (2,1) in track 551, trunks (1,2), (2,2) and (3,2) in track 552, and trunks (1,3) and (2,3) in track 553. In channel 502, the indices for trunks 504 are corresponding. For simplicity, terminals, doglegs, and branches are not illustrated.

The quality function QF is conveniently calculated as follows:

$$\text{Relative\_Trunk\_Length} = \frac{\sum_{k=1}^{K(i)} \text{Trunk\_Length}(k, i)}{\text{Track\_Length}} \quad (7.2)$$

-continued $$QF = \sum_{i=1}^{I} [\text{Relative\_Trunk\_Length}(i) * \exp(3*(i-\text{Init\_Track}))] \quad (7.4)$$

"Relative_Trunk_Length (i)" is the relative length of the sum of trunk lengths in relation to a total track length "Track_Length". "Init_Track" stands for a track index i between i=1 and I. Preferably, Init_Track is around I−1, I−2, or I−3, but other values can also be used. This has the advantage, that tracks between i=1 and Init_Track−1 are not considered and calculation time can be saved. The "exp" symbol stands here for "to the power of 10" (i.e. $10^{3*(i-\text{Init\_Track})}$). To use the track index i in the exponent gives additional weighing to the last tracks Init_Track, Init_Track+1, etc. Using the decimal power is convenient, but not necessary for the present invention. Persons of skill in the art are able, based on the description herein to apply a similar weighting with different bases.

In the example of FIG. 7, for channel 501, Relative_Trunk_Length (i) are 87.3% for track 551 (7.6)

64.2% for track 552

45.2% for track 553 resulting in a quality function of $QF_1=452{,}642{,}873$. For channel 502, Relative_Trunk_Length (i) are 45.2% for track 551 (7.8)

64.2% for track 552

87.3% for track 553 resulting in a quality function of $QF_2=873{,}642{,}452$.

In the example of FIG. 1, the trunks in tracks i=1 and i=2 have relative lengths of Relative_Length (1)=[(3+3)/8]≈0.75 (7.10)

Relative_Length (2)=[(4+4)/8]≈1.0 (7.12)

(track 2 completely filled)
and the quality function QF (for Init_Track=1) is obtained as:

$QF=0.75*10^0+1.0*10_3=1000.75$ (7.14)

Preferably, QF has small values. The smaller QF, the better the routing. For example, the routing in channel 501 is better than in channel 502. Preferably, quality function QF is calculated only for these layers which have only trunks ("horizontal layers"). Optionally, an average for QF of two or more layers can be used.

Figure 8:
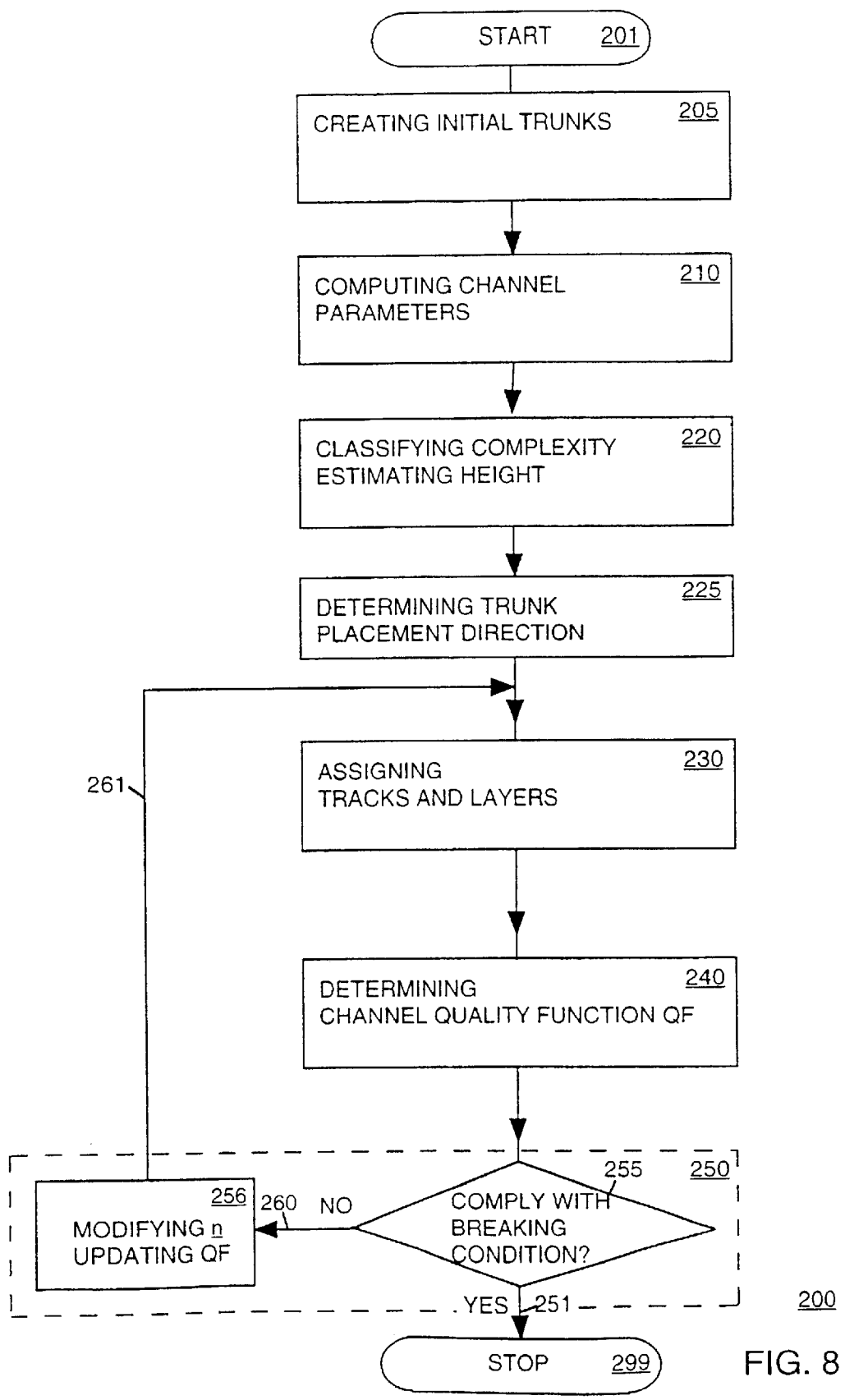
FIG. 8 illustrates a simplified flow chart diagram of a method of the present invention.

FIG. 8 illustrates a simplified flow chart diagram of method 200 of the present invention. Method 200 comprises the following steps: creating initial trunks step 205, computing channel parameters step 210, classifying complexity and estimating channel height step 220, assigning tracks to layers step 230, determining channel quality function step 240, optimizing step 250 (query 255 "COMPLY WITH BREAKING CONDITION?", modifying step 256) with a conditional repetition of steps 230 and 240 (see repetition line 260, 261). Determining trunk placement direction step 225 is optional and follows step 220. If step 225 is not performed, then step 230 uses a default value. For convenience, the steps of method 200 are illustrated as blocks. Arrows between the blocks indicate a preferred method flow. Start step 201 ("START") comprises necessary preparations, such as loading circuit data, and stop step 299 ("STOP") comprises necessary arrangements to use the optimization results, such as saving the final channel layout to memory. Start step 201 and stop step 299 are as such known in the art.

Method 200 is, preferably, executed by a computer which has a processor to interchange data, instructions (computer program), preliminary and final results with a memory or an interface. Preferably, the computer program with the method is stored on a storage device. For simplicity, such a computer, details of the program and the storage device are not shown. Persons of skill in the art, are able, based on the description herein, to implement method 200 without the need of further explanation.

In creating initial trunks step 205, the processor receive a netlist and location coordinates (e.g., X and Y) of the terminals and determines a preliminary number I of trunks. Step 205 is as such known in the art.

In computing channel parameters step 210, the processor computes a set of channel parameters. The parameters are, for example, parameters, CS, MCDS, r(D,P), BS and RF explained above.

In classifying complexity and estimating channel height step 220, the processor relates the channel parameters to the predetermined weighting parameters and classifies the channel complexity into the first type ("TYPE 1") or the second type ("TYPE 2"). The processor also selects the factor significance vector n according to the complexity type. Then, the processor estimates the channel height Channel_Height. (cf. equation 1.30).

In determining trunk placement direction step 225, the processor calculates parameter RF and determines a preferred vertical placement direction from i=1 to i=I (default value, cf. index i in FIGS. 1–2) or from i=I to i=1 (as primed index i' in FIG. 2).

Figure 9:
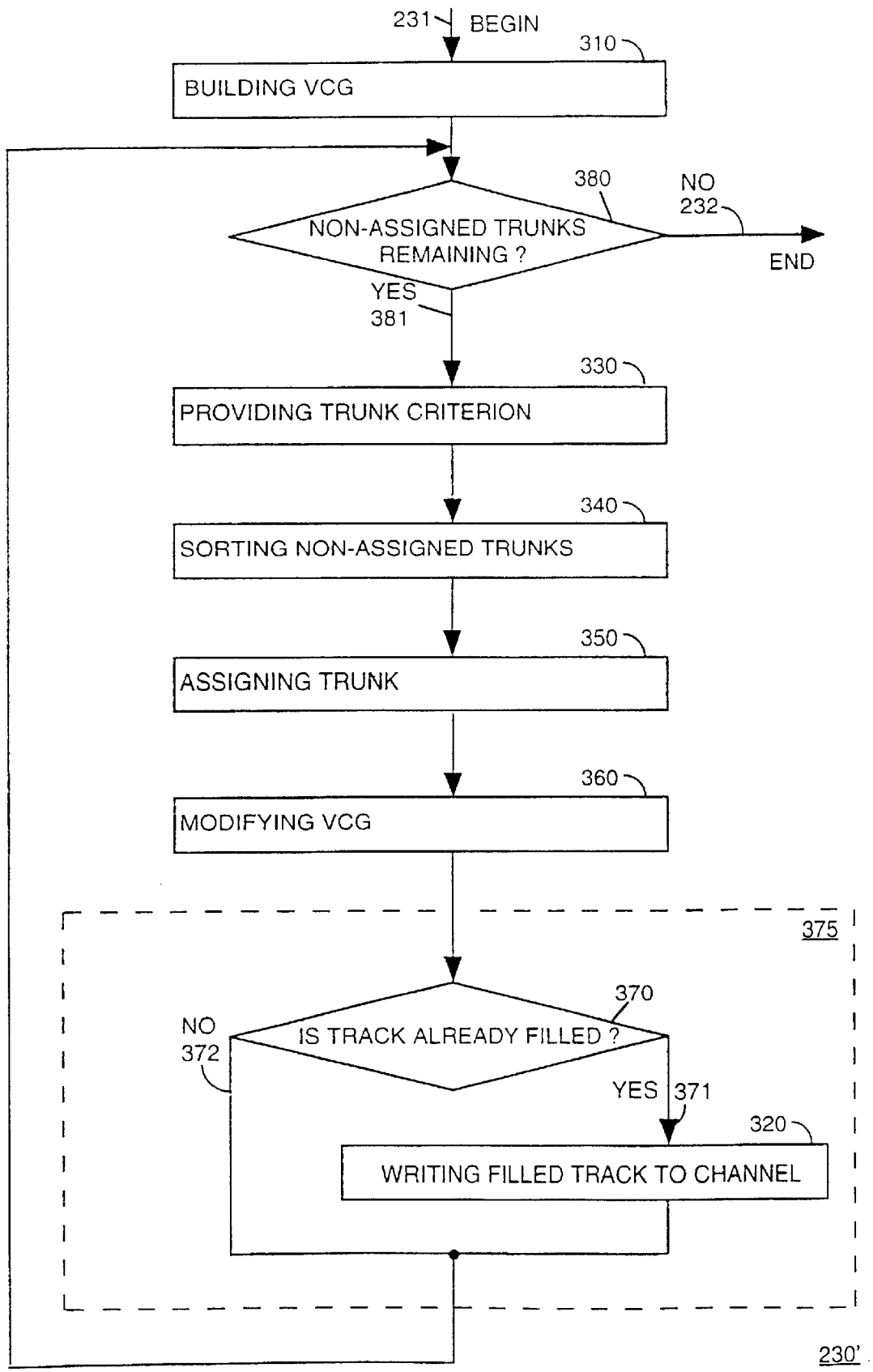
FIG. 9 illustrates a simplified flow chart diagram of a step in the method of FIG. 8.

In assigning tracks and layers step 230, the processor provides the track and layer assignment for channel 100 by using the preliminary channel height Channel_Height. A flow chart diagram of modified step 230' with new features according to the present invention is illustrated in FIG. 9.

In step 230, the processor determines, among others, the lengths of each trunk, hereinafter labeled "Trunk_Length (k, i)" with k=1 to K(i) as a counter for trunks (in each track i), and i=1 to I as the above mentioned track index. In reference to the example of FIG. 1, values are in track i=1 (K(1)=2), Trunk_Length (1, 1)=2 horizontal units (trunk 141, i=1) and Trunk_Length (2, 1)=2 horizontal units (trunk 142, i=1), and in track i=2 (K (2)=2), Trunk_Length (1, 2)=3 horizontal units (trunk 143, i=I=2), and Trunk_Length (2, 2)=3 horizontal units (trunk 144, i=2).

It is an advantage of the present invention, that step 230' (details see FIG. 9) uses the factor significance vector n.

In determining channel quality function step 240, the processor determines the quality function QF for channel 100 using track and layer assignment of step 230. According to the invention, the processor uses significance vector n to obtain QF.

Optimizing step 250 (dashed frame) comprises (a) the check of an iteration criterion (query step 255) and (b), conditionally, the modification of factor significance vector n (step 256) and repetition of steps 230 and 240 (lines 260, 261). Optionally, inst step 256, the quality function QF is updated based on the previously performed assignment.

Preferably, optimizing step 250 is performed as a downhill simplex optimization known in the art. This is convenient, but not essential for the present invention. For example, such a downhill simplex optimization is described in: [7] W. Spendley, G. R. Hext, F. R. Himsworth: "Sequential Application of Simplex Design in Optimization and Evolutionary Operations", Technometrics, 1962, vol. 4, No. 4, page 441f.; [8] J. A Nelder and R. Mead, Computer Journal, vol. 7, 1965, pp. 308–313; [9] David M. Himmelblau. "Applied Nonlinear Programming", McGraw-Hill Book Company, 1972.

For simplicity, all details of step 250 are therefore not illustrated. Query step 255 can be described as answering to the question "COMPLY WITH BREAKING CONDITION?" The term "breaking condition" is used for predetermined conditions which have to be met in order to stop the iteration. For example, and with no intention to be limiting, conditions can be:

(a) The processor can abort the iteration upon reaching a predetermined maximum execution time. In an convenient implementation, the processor counts the iterations and stops at a predetermined maximum number.

(b) The processor can abort the iteration when the quality function has not significantly changed during a predetermined number of iterations.

(c) The processor aborts the iteration depending on an optimization test. For example, for downhill simplex optimization, the elements of vector n determine a so-called simplex value which is compared to a predetermined reference value.

It is not important for the present invention, whether (a) to (c) have be all in compliance (logical and relation) or whether only some have to be (logical or relation). Persons of skill in the art are able, based on the description herein, to apply other breaking conditions.

Upon compliance ("YES"-line 251 to stop 299), method 200 is terminated. Otherwise, the processor modifies vector n (step 256) and goes to step 230 (cf. "NO"-line 260).

FIG. 9 illustrates a simplified flow chart diagram of modified step 230' if method 200 of FIG. 8 in a preferred embodiment of the present invention. Persons of skill in the art are able, based on the description herein, to change step 230 without departing from the scope of the invention. In FIGS. 8–9, lines 231 and 232 are corresponding and indicate begin and end of step 230/230'. Step 230' comprises building VCG step 310, query step 380 ("NON-ASSIGNED TRUNKS REMAINING?"), providing non-assigned trunk criterion step 330, sorting non-assigned trunks step 340, assigning trunk step 350, modifying VCG step 360, and filling step 375 (dashed frame with query step 370 and writing filled track to channel step 320). Executing initially step 310, the processor executes steps 330, 340, 350, 360 and 375 as long as non-assigned trunks remain ("YES"-line of query step 380). Such a trunk can be, for example, a trunk a the top of the sorted criterion list (cf. step 340). Otherwise ("NO" on line 232), the processor continues method 200 with step 240 (cf. FIG. 8).

In building VCG step 310, the processor builds a VCG based on the non-assigned trunks. Such a step is known in the art, so that persons of skill in the art can implement step 310 without further explanation herein.

Query step 380 explained above is executed next.

In providing non-assigned trunk criterion step 330, the processor calculates criterion Cr for each non-assigned trunk or for trunk portions. As a result, the processor obtains a criterion list in which the values of Cr are related to trunk indices (e.g., i and k). Replacing the trunk indices by letters "A", "B", and "C" as convenient labels for the trunks, the list is, for example, Cr (A)=2.4, Cr (B)=1.0, and Cr (C)=8.0. In other words, the still non-assigned trunks (or portions) receive characteristic values (Cr).

In sorting non-assigned trunks step 340, the processor sorts the criterion list for ascending Cr-values. (e.g., to Cr (B), Cr (A), Cr (C)). Preferably, the trunks (or trunk portions) which fit best into the track (cf. FIG. 6, track portion 442) are these with the highest Cr-values (e.g., Cr (C)).

In assigning trunk step 350, the processor assigns the best fitting trunks (or portions) to the track.

In modifying VCG step 360, the processor modifies the VCG using the assignment of step 350.

In filling step 375, the processor executes step 320 for tracks already filled with trunks ("YES"-line 371 of query "IS TRACK ALREADY FILLED?"). In writing filled track to channel step 320, the processor stores the channel assignment. Step 320 can also be implemented without further explanation. If in the previous steps no suitable trunks or trunk portions have been identified, then the processor leaves out step 320 ("NO"-line 372 of query step 370 going to step 380).

Figure 10:
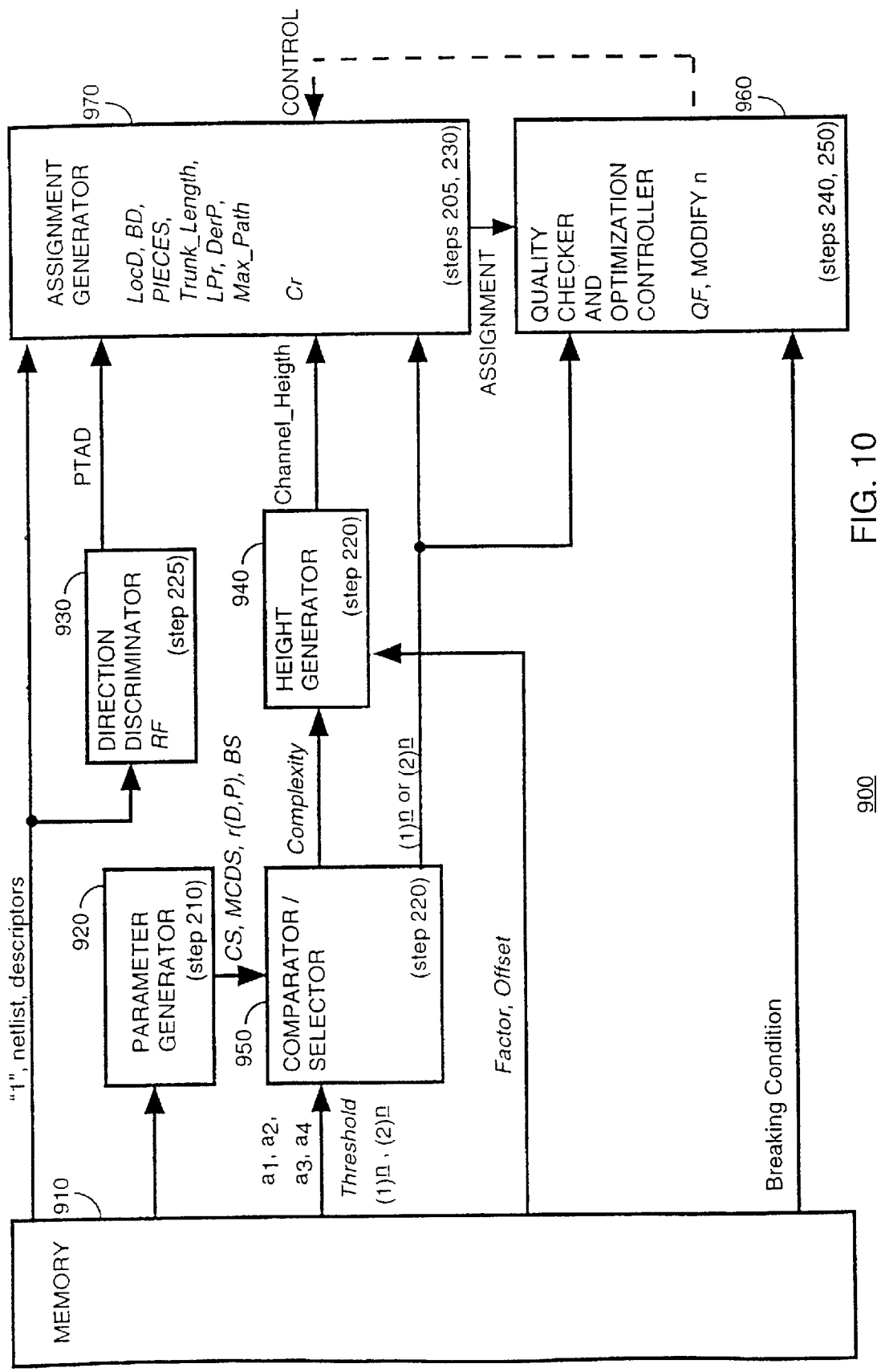
FIG. 10 illustrates a simplified block diagram of a routing system according to the present invention.

FIG. 10 illustrates a simplified block diagram of routing system 900 according to the present invention. System 900 is intended to be an example for explanation. Those of skill in the art are able, based on the description herein, to implement the present invention on other systems, such as, for example, on all-purpose processors.

System 900 conveniently comprises the following elements: memory 910, parameter generator 920, direction discriminator 930 (optional), height generator 940, comparator/selector 950, quality checker and optimization controller 960. Plain lines with arrows between the elements illustrate signals representing the above explained variables. A dashed line from controller 960 to assignment generator 970 illustrates controlling.

Memory 910 conveniently stores a netlist, the basic descriptors, the "1" (cf. RF), weighting parameters $a_1$ to $a_4$, Threshold (cf. equation (3.4), (3.6)), initial n-vectors, the breaking condition (cf. step 250), Factor, Offset, and others.

Parameter generator 920 receives the netlist and the descriptors, performs method step 210 and provides channel parameters CS, MCDS, r(D,P), and BS. Comparator/selector 950 receives CS, MCDS, r(D,P), and BS, receives parameters $a_1$ to $a_4$, Threshold, the initial n-vector. Performing step 220, comparator/selector 950 provides Complexity and selects either vector $_{(1)}n$ or $_{(2)}n$. Height generator 940 receives Complexity, Factor, Offset, and—while participating also in step 220—provides Channel_Heigth. Direction discriminator 930 optionally receives "1" and the netlist and provides PTAD (step 225). Assignment generator 970 receives, "1", the netlist, the descriptors, PTAD, Channel_ Heigth, and, preferably, performs steps 205 and 230. Thereby, assignment generator 970 provides the trunk assignment. Quality checker and optimization controller 960 performing steps 240 and 250 receives the trunk assignment, the breaking condition, and the selected vector n ($_{(1)}n$ or $_{(2)}n$), and controls assignment generator 970 (see dashed line in FIG. 10 and repetition line 260, 261 in FIG. 8).

Having described details of method 200, the present invention is now described as a method for manufacturing an electronic device having channel 100 with connections (e.g., trunks) for wiring a number of nets which are selectively located in predetermined locations (e.g., tracks identified by indices k, i, m) in a common direction (e.g., horizontal), wherein the locations can be in common layers (see index dm, cf. unreserved layer model) or in different layers (see index m, cf. reserved layer model) of the channel. Preferably, the method comprises the steps of:

(i) Providing preliminary assignments for the connections to the locations and deriving pluralities of preliminary assignment components (e.g., LocD, PIECES, BD, Trunk_Length, LPr, DerP, Max_Path, depending on k, i, m) for each preliminary assignment (e.g., see steps 205, 210, 220, 225); (ii) Providing a plurality (see Cr(A), Cr(B), Cr(C)) of criteria (e.g., Cr (i,k,m)) for each preliminary assignment by combining the preliminary assignment components to a significance vector (e.g., vector n) (cf. step 330, 340); (iii) Scanning the plurality of criteria and selecting a preliminary assignment (e.g., step 340); and (iv) Converting the preliminary assignment to a permanent assignment (cf. step 350).

Also, the present invention can be described as a method for routing a net in the channel of a circuit having internal terminals (e.g., non-terminals) which is performed in an apparatus (e.g., all-purpose computer) for optimizing the layout. The method has the following method steps: (a) Assigning tracks (index i) and layers (index m) to trunks (index k, i, m) by selecting an assignment for which an assignment criterion has an extreme value (e.g., highest Cr, step 340), the criterion (e.g., Cr) being provided by relating a plurality of assignment components (e.g., LocD, PIECES, BD, Trunk_Length, LPr, DerP, Max_Path) to a significance vector (e.g., vector R) (cf. step 230); (b) Determining a quality function (e.g., QF) of the assignment (cf. step 240); and (c) Optimizing the assignment by repeating steps (a) and (b) and modifying the significance vector (step 256).

Preferably, in step (a), the criterion (Cr) is calculated as the multiple sum ($\Sigma$) of intermediate values (cf. ( )$^{nq}$ in equation (6.16)), wherein each intermediate value is a component (e.g., LocD, . . . , or Max_Path) to the power of a vector element (e.g., nq) in the significance vector (e.g., vector n). In step (a), a significance vector (vector n) is used which is selected from a set of two or more vectors (e.g., $_{(1)}$n and $_{(2)}$n, wherein the selection is determined by a channel complexity (e.g., Complexity). The channel complexity (e.g., Complexity) is a function (cf. equation (1.18) of channel parameters (e.g., CS, MCDS, r(D,P), and BS) and predetermined weighting factors (e.g., $a_1$ to $a_4$).

While the invention has been described in terms of particular structures, systems, and methods, those of skill in the art will understand based on the description herein that it is not limited merely to such examples and that the full scope of the invention is properly determined by the claims that follow.

What is claimed is:

1. A method for routing nets with trunks in a channel, said method comprising the following steps:

(a) computing a set of channel parameters;

(b) classifying a channel complexity into a first type or a second type by relating said channel parameters to predetermined weighting parameters and estimating a preliminary channel height from said channel parameters;

(c) providing a preliminary track and layer assignment for trunks using said preliminary channel height in accordance with the classification of step (b);

(d) determining a quality function for said channel using said track and layer assignment;

(e) conditionally repeating steps c) and d) until said quality function is in a predetermined relation to a predetermined breaking condition; and (f) converting said preliminary track and layer assignment into a permanent assignment.

2. The method for routing of claim 1, wherein in said step (a), a first channel parameter is the ratio between an average channel density and a maximum channel density.

3. The method for routing of claim 1, wherein in said step (a), a second channel parameter is the ratio between the number of saturated columns and the total number of columns in said channel.

4. The method for routing of claim 1, wherein in said step (a), a third channel parameter is a correlation coefficient between a channel density and a path length of a vertical constraint graph.

5. The method for routing of claim 1, wherein in said step (a), a fourth channel parameter is the ratio between the number of occupied columns and the total number of columns.

6. The method for routing of claim 1, wherein in step (e), downhill simplex iteration is applied.

7. The method for routing of claim 1, wherein in step (d), the quality function is obtained by estimating trunk lengths in relation to a track length.

8. The method for routing of claim 1, wherein in step (c), the preliminary track and layer assignment is selected by using an assignment criterion.

9. The method of claim 1, wherein in step (c) the preliminary track and layer assignment is selected by an assignment criterion which is related to a plurality of components and selectively a first significance vector for said first type and a second significance vector for said second type.

10. The method of claim 9, wherein in step (e), either the first significance vector or the second significance vector is modified.

11. A method for manufacturing an electronic device having a channel with connections for wiring a number of nets which are selectively located in predetermined locations in a common direction, wherein said locations can be in common layers or in different layers of said channel, said method comprising the steps of:

providing preliminary assignments for said connections to said locations and deriving pluralities of preliminary assignment components for each preliminary assignment;

providing a plurality of criteria for each preliminary assignment by relating the preliminary assignment components to a significance vector;

from said plurality of criteria, selecting a preliminary assignment; and converting said preliminary assignment to a permanent assignment.

12. A method for routing a net in a channel of a circuit having terminals to be coupled across the channel, said method being performed by an apparatus for optimizing and comprising the following steps:

(a) assigning tracks and layers to trunks by selecting an assignment for which an assignment criterion has an extreme value, said criterion being provided by relating a plurality of assignment components to a significance vector;

(b) determining a quality function of said assignment;

(c) optimizing said assignment by repeating steps (a) and (b) and modifying said significance vector.

13. The method of claim 12 wherein in step (a), said criterion is calculated as the multiple sum of intermediate values, wherein each intermediate value is a component to the power of a vector element in said significance vector.

14. The method of claim 12 wherein in step (a) a significance vector is used which is selected from a set of two or more vectors, wherein the selection is determined by a channel complexity.

15. The method of claim 14 wherein said channel complexity is a function of channel parameters and predetermined weighting factors.

16. The method of claim 12 wherein in step (a), said plurality of assignment components has a first component which is a maximum of a local channel density.

17. The method of claim 12 wherein in step (a), said plurality of assignment components has a second component which is a number of trunk pieces.

18. The method of claim 12 wherein in step (a), said plurality of assignment components has a third component which is related to the number of non-vacant terminals in an upper boundary and in a lower boundary of said channel.

19. The method of claim 12 wherein in step (a), said plurality of assignment components has a fourth component which is a trunk length.

20. The method of claim 12 wherein in step (a), said plurality of assignment components has a fifth component which indicates a layer priority and considers different channel models.

21. The method of claim 12 wherein in step (a), said plurality of assignment components has a sixth component which is the highest difference between the lengths of the longest paths in a vertical constraint graph for trunks going through a column in said channel.

22. The method of claim 12 wherein in step (a), said plurality of assignment components has a seventh component which is the maximum number of nodes in a vertical constraint graph representation of required connections between non-vacant terminals.

23. The method of claim 12 wherein in step (c), optimizing is performed by downhill simplex optimization.

24. The method of claim 12 wherein in said step (c), optimizing is aborted when said quality function has not significantly changed.

25. A program storage device embodying a program executable by a computer to perform a method for determining a trunk assignment direction for routing nets in a channel, said channel having a first number of non-vacant terminals at a first boundary and a second number of non-vacant terminals at a second boundary, said method comprising the following steps:

obtaining a vertical constraint graph (VCG) with nodes and edges of the channel;

determining a first number of nodes in the VCG from which edges depart and determining a second number of nodes in the VCG to which edges arrive;

combining the first and second numbers of non-vacant terminals and the first and second numbers of nodes to a parameter; and comparing the parameter to a predetermined value and (i) in case the parameter is smaller than or equal to predetermined value, determining the direction from the second boundary to the first boundary, or (ii) in case the parameter is larger than the predetermined value, determining the direction from the first boundary to the second boundary.

26. The program storage device of claim 25 wherein in said combining step of said method, the first number of non-vacant terminals is Upper_Terminals, the second number of non-vacant terminals is Lower_Terminals, the first number of nodes is Edge_Departing_Nodes, and the second number of nodes is Edge_Arriving_Nodes, and the parameter is RF and calculated as:

$$RF = \frac{(\text{Upper\_Terminals} + 1) * \text{Edge\_Departing\_Nodes}}{(\text{Lower\_Terminals} + 1) * \text{Edge\_Departing\_Nodes}},$$

and wherein for RF≦1, the direction goes from the second boundary to the first boundary and for RF>1, the direction goes from the first boundary to the second boundary.

* * * * *